United States Patent
Ucelli et al.

(10) Patent No.: US 11,433,403 B2
(45) Date of Patent: Sep. 6, 2022

(54) ELECTRONIC DRIVING CIRCUIT FOR DRIVING ELECTRODES OF A MICROFLUIDIC DEVICE FOR MANIPULATION OF PARTICLES, AND CORRESPONDING ANALYSIS APPARATUS

(71) Applicant: Menarini Silicon Biosystems S.p.A., Castel Maggiore (IT)

(72) Inventors: Mauro Ucelli, Bondeno (IT); Andrea Tommasi, Castenaso (IT); Gianni Medoro, Casalecchio di Reno (IT)

(73) Assignee: Menarini Silicon Biosystems S.p.A., Castel Maggiore (IT)

( * ) Notice: Subject to any disclaimer, the term of this patent is extended or adjusted under 35 U.S.C. 154(b) by 307 days.

(21) Appl. No.: 16/342,890

(22) PCT Filed: Oct. 18, 2017

(86) PCT No.: PCT/IB2017/056482
§ 371 (c)(1),
(2) Date: Apr. 17, 2019

(87) PCT Pub. No.: WO2018/073768
PCT Pub. Date: Apr. 26, 2018

(65) Prior Publication Data
US 2021/0283622 A1 Sep. 16, 2021

(30) Foreign Application Priority Data
Oct. 18, 2016 (IT) .................. 102016000104760

(51) Int. Cl.
*B01L 3/00* (2006.01)
*B03C 5/02* (2006.01)
(Continued)

(52) U.S. Cl.
CPC ........ *B03C 5/005* (2013.01); *B01L 3/502715* (2013.01); *B01L 3/502761* (2013.01);
(Continued)

(58) Field of Classification Search
CPC ......... B03C 5/005; B03C 5/026; H03F 3/217; G01N 27/44791; B01L 3/502761;
(Continued)

(56) References Cited

U.S. PATENT DOCUMENTS

| 6,942,776 B2 | 9/2005 | Medoro |
| 2010/0182083 A1 * | 7/2010 | Maeda .................. H03F 1/30 330/251 |
| 2016/0030951 A1 | 2/2016 | Gascoyne et al. |

OTHER PUBLICATIONS

Current et al. (IEEE Transactions on biomedical circuits and systems vol. 1., No. 2, Jun. 2007 (Year: 2007).*
(Continued)

*Primary Examiner* — Jill A Warden
(74) *Attorney, Agent, or Firm* — Marshall, Gerstein & Borun LLP (57) ABSTRACT

An electronic driving circuit for a microfluidic device, having a number of synchronized driving stages to generate a respective driving signal for each electrode or group of electrodes of the microfluidic device, the driving signals having a desired amplitude, frequency and phase-shift. Each driving stage has a switching-mode amplifier stage to receive a clock signal and a target signal and to generate, at an output thereof, an output signal defining a respective driving signal. The amplifier stage has: a switching module, coupled to a first internal node and controlled by the clock signal for selectively bringing the first internal node to a control signal; a filter module, coupled between the first internal node and the output, to provide the output signal; and a feedback module.

17 Claims, 6 Drawing Sheets

(51) Int. Cl.
    *H03F 3/217*     (2006.01)
    *B03C 5/00*     (2006.01)
    *G01N 27/447*     (2006.01)

(52) U.S. Cl.
    CPC ....... *B03C 5/026* (2013.01); *G01N 27/44791* (2013.01); *H03F 3/217* (2013.01); *B01L 2300/0681* (2013.01); *B01L 2300/0819* (2013.01); *B01L 2400/0424* (2013.01); *H03F 2200/438* (2013.01)

(58) Field of Classification Search
    CPC ....... B01L 3/502715; B01L 2300/0819; B01L 2300/0681; B01L 2400/0424
    See application file for complete search history.

(56) References Cited

OTHER PUBLICATIONS

International Preliminary Report on Patentability, International Application No. PCT/IB/056482, dated Apr. 23, 2019.

International Search Report and Written Opinion, corresponding International application No. PCT/IB2017/056482, dated Dec. 18, 2017.

Current K W et al: "A High-Voltage SOI CMOS Excited Chip for a Programmable Fluidic Processor System", IEEE Transactions on Biomedical Circuits and Systems, IEEE, US vol. 1, No. 2, pp. 105-115, Jun. 1, 2007.

Manaresi L et al., "A CMOS Chip for Individual Cell Manipulation and Detection" IEEE Journal of Solid-State Circuits, vol. 38, No. 12, pp. 2297-2305, Dec. 1, 2003.

\* cited by examiner

ELECTRONIC DRIVING CIRCUIT FOR DRIVING ELECTRODES OF A MICROFLUIDIC DEVICE FOR MANIPULATION OF PARTICLES, AND CORRESPONDING ANALYSIS APPARATUS

CROSS-REFERENCE TO RELATED APPLICATION

This application is a U.S. National Stage of International Patent Application No. PCT/IB2017/056482 filed Oct. 18, 2017, which claims the benefit of priority of Italian Application No. 102016000104760 filed Oct. 18, 2016, the respective disclosures of which are each incorporated herein by reference in their entireties.

TECHNICAL FIELD OF THE INVENTION

The present invention relates to an electronic driving circuit for driving electrodes of a microfluidic device for manipulation of particles, and to a corresponding analysis apparatus cooperating with the microfluidic device; in particular, but without this implying any loss of generality, the microfluidic device is a device for selection and sorting of cells immersed in a fluid, by dielectrophoresis.

PRIOR ART

As it is known, micromachining techniques allow manufacturing of microfluidic devices, including, in a same chip, micromechanical structures, such as chambers, channels or separation barriers, and electrical structures, such as heaters, conductive paths, electrodes or processing circuits. The micromechanical and electrical structures are formed in one or more substrates, e.g. including semiconductor material, and housed in a package, which defines electrical contacts accessible to the outside and also one or more fluidic inlets and/or outlets.

Microfluidic devices allow to perform complex processing operations on particles, e.g. molecules, cells or groups of cells, such as operations of cell detection and sorting, DNA analysis or RNA replication. These processing operations may advantageously be performed in an automatic manner by a suitable analysis apparatus, coupled to the microfluidic devices.

Often, microfluidic devices define so called disposable "cartridges", which are to be filled with a fluid containing the particles to be analyzed.

In particular, the DEPArray™ is a known microfluidic device by the present Applicant, which allows to select and sort cells that are to be analysed.

As disclosed e.g. in U.S. Pat. No. 6,942,776 B2, in the name of the present Applicant, this microfluidic device is based on dielectrophoresis (DEP), i.e. the physical phenomenon whereby neutral particles, when subject to non-uniform, time stationary (DC) or time varying (AC) electric fields, experience a net force directed towards locations with increasing (pDEP) or decreasing (nDEP) field intensity.

If the intensity of the dielectrophoretic force is comparable to the gravitational force, an equilibrium may be established allowing to levitate small particles, which may therefore be separated (to be available for further processing operations) from a solution in which the same particles are contained.

Figure 1:
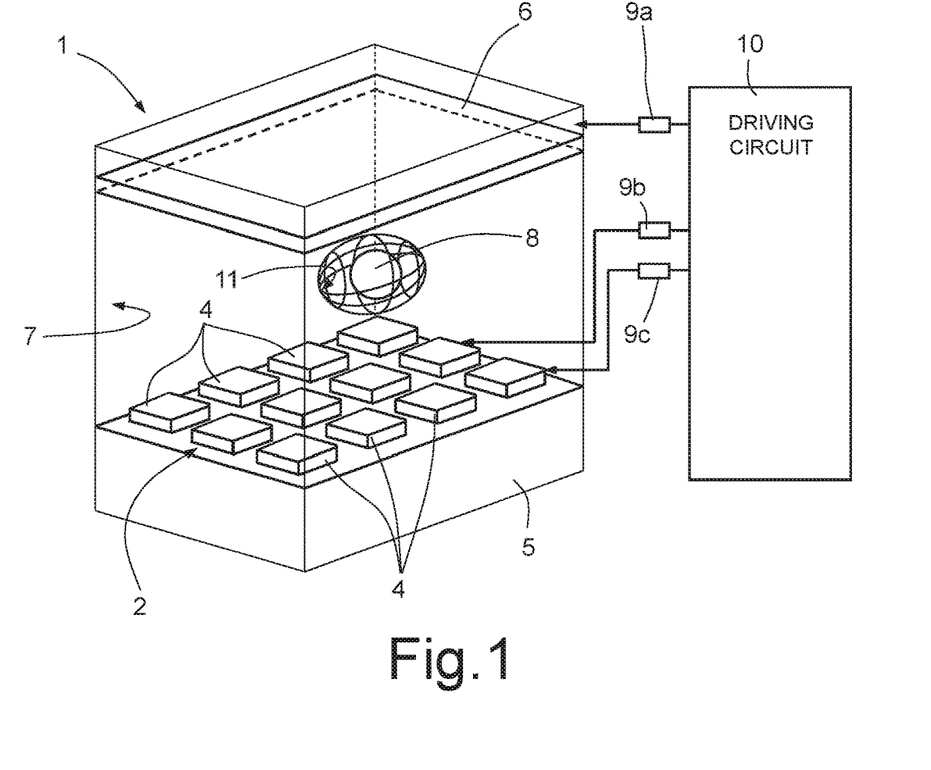
FIG. 1 shows a schematic view of a portion of a microfluidic device for manipulation of particles, with a related electronic driving circuit.

In more detail, and as shown in FIG. 1, the microfluidic device, denoted with 1, includes an array 2 formed by a number of rows and columns of electrodes 4, which are carried by a substrate 5 (being arranged on an insulating layer thereof, here not shown); the electrodes 4 are selectively addressable, e.g. by means of addressing electronic circuit elements that may be formed in the same substrate 5 (here not shown).

The microfluidic device 1 further includes an upper electrode plate 6, which is arranged above the array 2 and is separated by the electrodes 4, and an analysis chamber 7 is defined therebetween.

A buffer solution containing particles 8 that are to analyzed (only one of which is shown in FIG. 1, for clarity of depiction) may be introduced within the chamber 7, e.g. through at least one inlet defined in the package of the same microfluidic device 1 (here not shown).

As schematically shown, the package of the microfluidic device 1 also defines at least a first contact pad 9a, accessible from the outside, for electrically contacting the upper electrode plate 6; a second contact pad 9b, for electrically contacting a first group of electrodes 4 of the array 2; and a third contact pad 9c, for electrically contacting a second group of electrodes 4 of the array 2.

Driving electrical signals, e.g. sinusoidal periodic signals having suitable amplitude, frequency and phase-shift, are provided to the upper electrode plate 6, the first and the second group of electrodes 4 via the first, second and, respectively, third contact pads 9a, 9b, 9c.

As schematically shown in FIG. 1, these driving signals, denoted with $V_1$, $V_2$ and $V_3$ are generated by an electronic driving circuit 10, including amplifier circuit stages; the electronic driving circuit 10 may for example be part of an analysis apparatus cooperating with the microfluidic device 1.

In particular, by applying in-phase and counter-phase periodic driving signals to the electrodes 4, dielectric fields, in particular dielectrophoretic fields, more particularly one or more independent potential cages 11, may be established in the chamber 7, the strength of which may be varied by acting on the frequency as well as on the amplitude of the driving signals $V_1$, $V_2$, $V_3$ (by "potential cage" is meant herein a portion of space enclosed by an equipotential surface and containing a local minimum of the dielectrophoretic potential).

These potential cages 11 trap one or more particles 8, allowing them either to levitate steadily, or to move within the chamber 7, by simply changing the subset of electrodes 4 to which the driving signals $V_1$, $V_2$, $V_3$ are applied and/or by modifying the values of the same driving signals.

For example, if a first electrode 4 is in-phase with the upper electrode plate 6 and is surrounded by electrodes receiving counter-phase driving signals, a potential cage 11 is established above the same first electrode 4. Then, by simply applying in-phase signals to one of the adjacent electrodes 4 (in the same direction as a desired motion), and then reversing the phase of the driving signal supplied to the first electrode, the potential cage 11 disappears and then reappears above the adjacent electrode, being displaced one cell-pitch away from the previous electrode.

By repeating this operation, the trapped particle (or particles) 8 move in adjacent positions in the plane of the array 2. For example, a particle 8 to be analyzed may be moved towards a pick-up location (here not shown), from which it may be extracted from the microfluidic device 1, or at which the same particle 8 may undergo desired processing operations.

The present Applicant has realized that the generation of the driving signals $V_1$, $V_2$ and $V_3$ poses some issues, due to the particular nature of the load constituted by the microfluidic device 1, which may even compromise the correct operation and performance of the microfluidic device 1.

Figure 2:
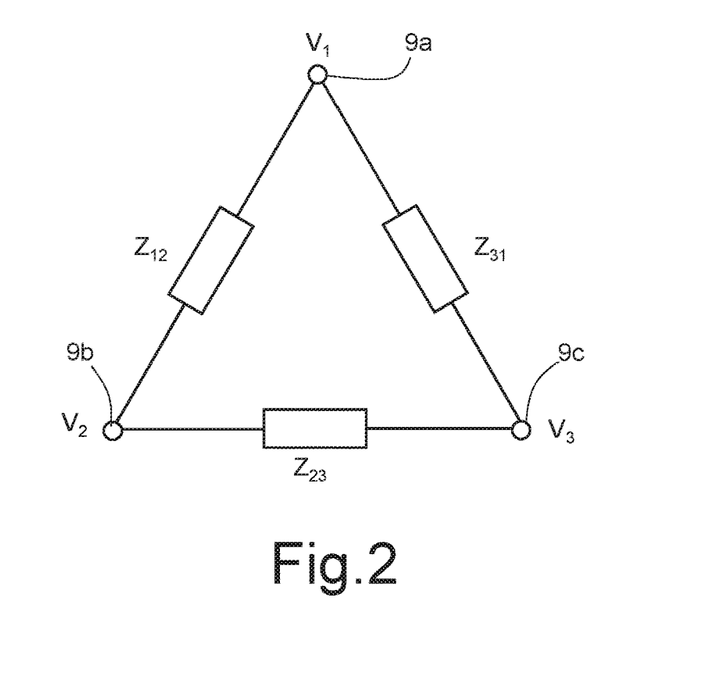
FIG. 2 is an electric representation of the electric load defined by the microfluidic device.

As shown in FIG. 2, from an electric point of view, the active chip of the microfluidic device 1, filled with the conductive buffer solution, can be considered as an unbalanced three-phase non-linear low impedance load in a so called "Delta" configuration. In particular, a first impedance $Z_{12}$ is defined between the first and second contact pads 9a, 9b; a second impedance $Z_{31}$ is defined between the first and third contact pads 9a, 9c; and a third impedance $Z_{23}$ is defined between the second and third contact pads 9a, 9b.

The non-linearity and the low impedance characteristics of the load cause a non-negligible harmonic distortion, which in turn yields to:

possible DC offset variations over-time between the driving signals $V_1$, $V_2$ and $V_3$;

a worsening of the efficiency, since part of the electric energy is not transferred to the active chip load for generation of the potential cages 11, but it is instead wasted in the form of heat generation (i.e. by Joule effect) within the electronic driving circuit 10;

a non-reproducibility of the performances, depending on the cage pattern, buffer solution characteristics and active chip variability.

In particular, the present Applicant has realized that it may be desirable to control the DC (Direct Current) components of the analog driving signals $V_1$, $V_2$ and $V_3$, in order to avoid:

electrolytic phenomena, since a DC voltage between two or more electrodes 4 close to each other may cause the generation of gases (i.e. bubbles) within the buffer solution inside the active area of the chip; and electro-corrosion, since, due to ox-redox phenomena, a DC voltage component may trigger corrosion of one or more of the electrodes 4, impairing their operation.

Formation of bubbles and damaging of the electrodes 4 may clearly affect the sorting and routing capability of the particles within the microfluidic device 1, and thus compromise its general performance.

The present Applicant has moreover realized that use of traditional linear amplifier circuits (e.g. class AB amplifiers) in the electronic driving circuit 10 may not allow to achieve the desired performances, at least in given operating conditions.

SUMMARY OF THE INVENTION

One object of the present invention is thus to provide an electronic driving circuit for a microfluidic device, allowing to overcome the limitations of known solutions, for example in terms of harmonic distortion and DC offset control.

The present solution relates to an electronic driving circuit for a microfluidic device, and to a corresponding analysis machine, as defined in the appended claims.

DETAILED DESCRIPTION OF THE INVENTION

Figure 3:
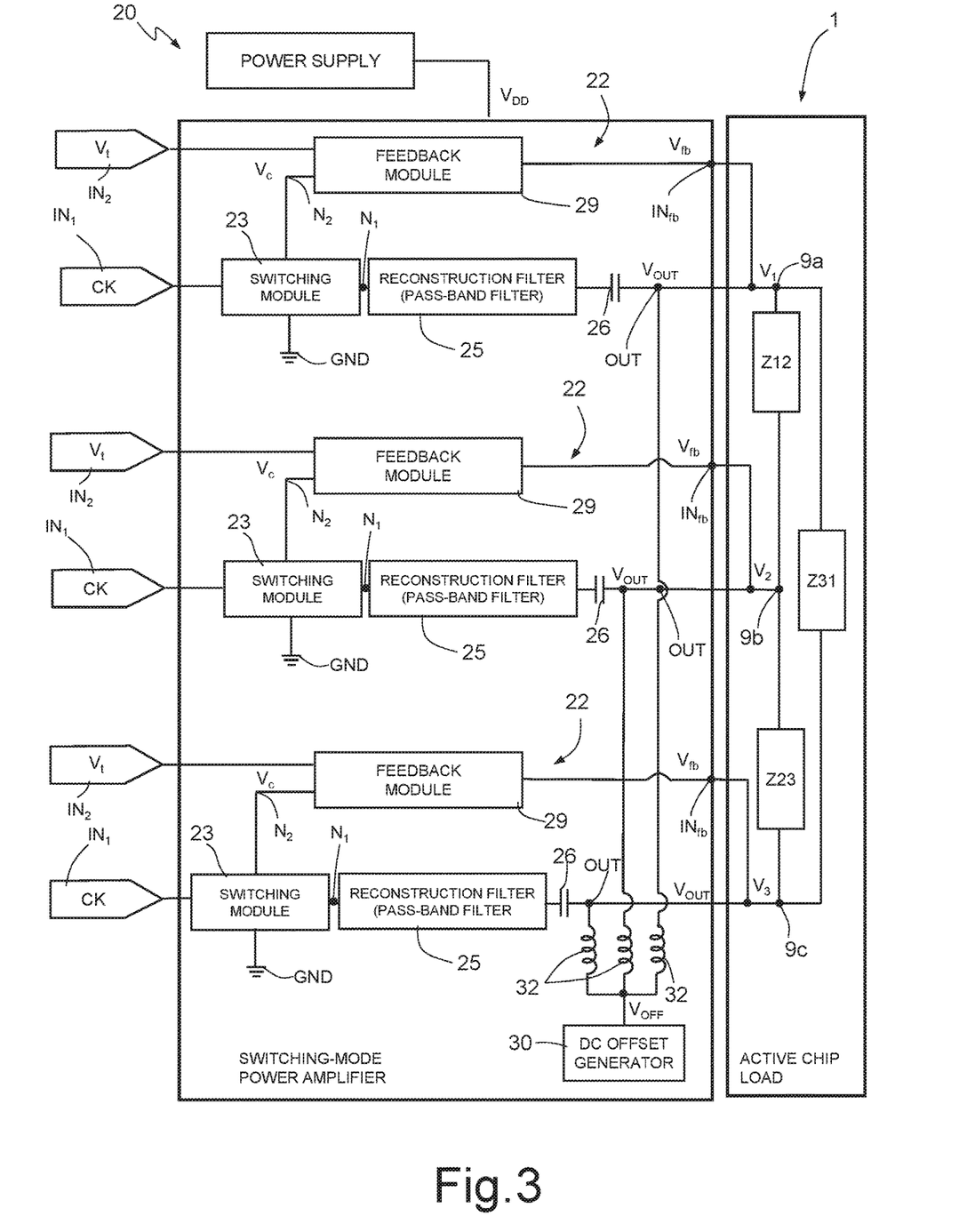
FIG. 3 is a schematic block diagram of the electronic driving circuit for the microfluidic device, according to one embodiment of the present solution.

FIG. 3 shows an electronic driving circuit, denoted with 20, coupled to a microfluidic device, in the example the microfluidic device 1 discussed with reference to FIG. 1, here shown with its electric-load equivalent representation (as discussed with reference to FIG. 2).

Accordingly, the microfluidic device 1 here represents an unbalanced three-phase non-linear low impedance load in "Delta" configuration, with the first impedance $Z_{12}$ between the first and second pads 9a, 9b; the second impedance $Z_{31}$ between the first and third pads 9a, 9c; and the third impedance $Z_{23}$ between the second and third pads 9a, 9b.

For example, in the simplified electrical model for the load: the first impedance $Z_{12}$ has a resistive component $R_{12}$ with a value comprised between 0.5e40Ω and a capacitive component $C_{12}$ with a value comprised between 24 pF e2.4 nF; the second impedance $Z_{31}$ has a resistive component $R_{31}$ with a value comprised between 0.1e130Ω and a capacitive component $C_{31}$ with a value comprised between 70 pF e7 nF; and the third impedance $Z_{23}$ has a resistive component $R_{23}$ with a value comprised between 0.01 e 1Ω and a capacitive component $C_{23}$ with a value comprised between 0.5 e50 nF.

As discussed previously, a respective electrode or group of electrodes 4, 6 of the microfluidic device 1 is coupled to each of the pads 9a, 9b, 9c.

The impedance of the active chip of the microfluidic device 1 may have real and imaginary part, be non-linear and change during time.

Electronic driving circuit 20 is configured to provide to each of the pads 9a, 9b, 9c a respective driving signals, again denoted with $V_1$, $V_2$ and $V_3$, for driving the respective electrode or group of electrodes.

In particular, the electronic driving circuit 20 includes a number of synchronized switching-mode amplifier stages 22, one for each electrode or group of electrodes to be driven with a respective driving signal $V_1$, $V_2$, $V_3$, or, analogously, one for each pad 9a, 9b, 9c of the microfluidic device 1.

Each amplifier stage 22 has:

an output Out, that is to be coupled to a respective pad 9a, 9b, 9c of the microfluidic device 1 (and the respective electrode or group of electrodes), on which an output voltage $V_{out}$ is present (defining the respective driving signal for the microfluidic device 1);

a first input $IN_1$, designed to receive a clock signal CK, e.g. a pulse train (or square wave) signal with a given frequency f;

a second input $IN_2$, designed to receive a target signal $V_t$, in particular a voltage signal defining a target (or desired) amplitude for the output voltage $V_{out}$ (as will be clarified hereinafter);

a feedback input $IN_{fb}$, designed to receive a feedback signal $V_{fb}$, for example a voltage signal, indicative of the driving signal supplied to the load (i.e., of the output voltage $V_{out}$).

In particular, the feedback signal $V_{fb}$ is picked-up as close as possible to the load; in a possible embodiment, as shown in FIG. 3, the pick-up point of the feedback signal $V_{fb}$ is located within the active chip of the microfluidic device 1, in the example at the respective pad 9a, 9b, 9c.

In particular, clock signals CK received by the amplifier stages 22 are designed to synchronize operation of the same amplifier stages 22.

In detail, each amplifier stage 22 comprises:

a switching module 23, having a switching input coupled to the first input $IN_1$ and receiving the clock signal CK, an output coupled to a first internal node $N_1$, a signal input coupled to a second internal node $N_2$ and receiving a control signal $V_c$, and also a reference input coupled to a reference terminal, or ground (GND);

a reconstruction filter module 25, in particular a band-pass filter, having an input terminal coupled to the first input $IN_1$ and an output terminal coupled to the output Out of the amplifier stage 22 via a blocking capacitor 26; and a feedback module 29, having an input coupled to the feedback input $IN_{fb}$ of the amplifier stage 22, thereby being designed to receive the feedback voltage $V_{fb}$, a reference input coupled to the second input $IN_2$ of the same amplifier stage 22 and a feedback output coupled to the second internal node $N_2$ (and to the switching module 23).

The feedback input of feedback module 29 is positioned as close to the load as possible, typically not inside the amplifier stage 22; according to a possible solution, the feedback input is within the active chip of the microfluidic device 1.

The electronic driving circuit 20 has a supply input 20a designed to receive a power supply voltage $V_{DD}$, and further comprises, common to all the amplifier stages 22, a DC offset generator 30, configured to generate, at an offset output thereof, a controlled DC offset voltage $V_{off}$ (the DC offset generator 30 may include a voltage generator of a known type, e.g. of the band-gap type, here not discussed in detail).

According to a possible embodiment, the DC offset voltage $V_{off}$ is equal to 50% of the supply voltage $V_{DD}$ of the microfluidic device 1, for example 2.5 V in the case in which the supply voltage $V_{DD}$ is 5 V.

Each amplifier stage 22 is coupled to the offset output of the DC offset generator 30 via a respective offset inductor 32, which is coupled between the offset output and the output Out of the same amplifier stage 22.

As shown in the same FIG. 3, therefore, the offset inductors 32 of the various amplifier stages 22 are connected in a so-called "Wye" configuration, having a first terminal in common (coupled to the output of the DC offset generator 30), and a second terminal coupled to the output Out of the respective amplifier stage 22, injecting therein the DC offset voltage $V_{off}$.

Electronic driving circuit 20 operates to generate at the output Out of the amplifier stages 22 output signals $V_{out}$ having desired frequency, amplitude and mutual phase-shift (as discussed, these output signals $V_{out}$ are to be supplied as driving signals to the microfluidic device 1). According to a possible embodiment, the output signals $V_{out}$ are analog sinusoidal signals.

In particular, the frequency and phase-shift characteristics of each output signal $V_{out}$ are determined by the clock signal CK received at the first input $IN_1$ of the respective amplifier stage 22, which determines the switching timing of the switching element 24.

The reconstruction filter module 25 has a very narrow bandwidth, centered at the desired operating frequency for the output signal $V_{out}$, thus selecting from the signal at the first internal node $N_1$ only this fundamental operating frequency and transferring it to the output Out.

The desired amplitude of the output signal $V_{out}$ is instead controlled by the target signal $V_t$ received at the second input $IN_2$ of the respective amplifier stage 22, via the closed feedback loop defined by the feedback module 29.

In particular, the feedback module 29 is configured to generate, based on the comparison between the feedback signal $V_{fb}$ and the target signal $V_t$, a control signal $V_c$.

The control signal $V_c$, provided to the switching module 23, defines the amplitude of the voltage that is selectively provided at the first internal node $N_1$, when the switching module 23 internally defines a coupling between the first and second internal nodes $N_1$i, $N_2$. The control signal $V_c$ thus defines the amplitude of the output signal $V_{out}$, amplitude-modulating the clock signal CK received at the first input $IN_1$ of the amplifier stage 22.

The blocking capacitor 26, before the output Out, blocks any spurious DC component at the output of the reconstruction filter module 25, so that the DC offset voltage $V_{off}$, provided by the DC offset generator 30 via the offset inductor 32, comes to constitute the only DC component in the output signal $V_{out}$.

In particular, a unique and controlled DC offset value is therefore present in all the output signals $V_{out}$ of the various amplifier stages 22.

It is noted that the offset inductor 32 moreover decouples the DC offset generator 30 from the AC output signal $V_{out}$.

Figure 4:
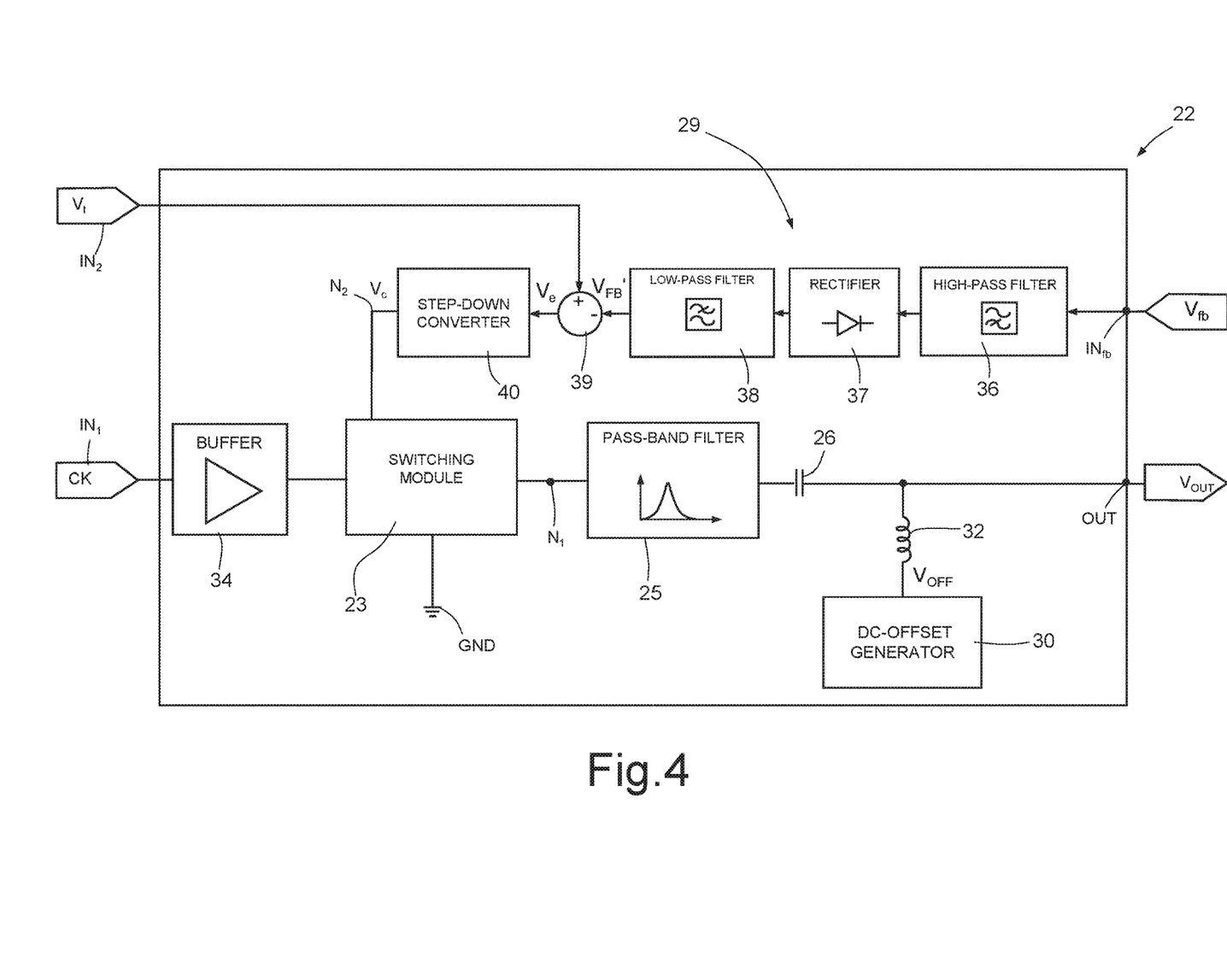
FIG. 4 is a schematic block diagram of an amplifier stage of the electronic driving circuit of FIG. 3.

With reference to FIG. 4, a possible circuit embodiment for the feedback module 29 of each amplifier stage 22 is now discussed; in the same FIG. 4, a buffer amplifier 34 is also shown, receiving the clock signal CK and providing a switching signal to the switching input of the switching module 23 based on the same clock signal CK (the signal switching between 0 V and the power supply voltage $V_{DD}$.

In this embodiment, the feedback module 29 includes:

a high-pass-filter 36, coupled to the feedback input $IN_{fb}$ of the amplifier stage 22 and configured to perform a high-pass filtering of the feedback signal $V_{fb}$, thereby blocking-out the low frequency (particularly the DC) components thereof;

a rectifier 37, coupled to the output of the high-pass filter module 36 and configured to extract the amplitude value from the filtered feedback signal $V_{fb}$;

a low-pass filter 38 coupled to the output of the rectifier module 37 and configured to perform a low-pass filtering operation, for generating a comparison signal $V_{FB}'$, that is therefore indicative of the amplitude value of the output signal $V_{out}$;

a subtraction unit 39, receiving the comparison signal $V_{FB}'$ from the rectifier 37 and the target signal $V_t$ provided at the second input $IN_2$ of the amplifier stage 22, and configured to generate a difference (or error) signal $V_e$, based on the difference between the comparison signal $V_{FB}'$ and the target signal $V_t$; and a voltage converter 40, in particular a step-down voltage converter, which receives the error signal $V_e$ and generates a regulated DC output voltage representing the control signal $V_c$ that is fed-back to the switching module 23, for modulating the input clock signal CK and setting the amplitude of the output signal $V_{out}$.

Figure 5:
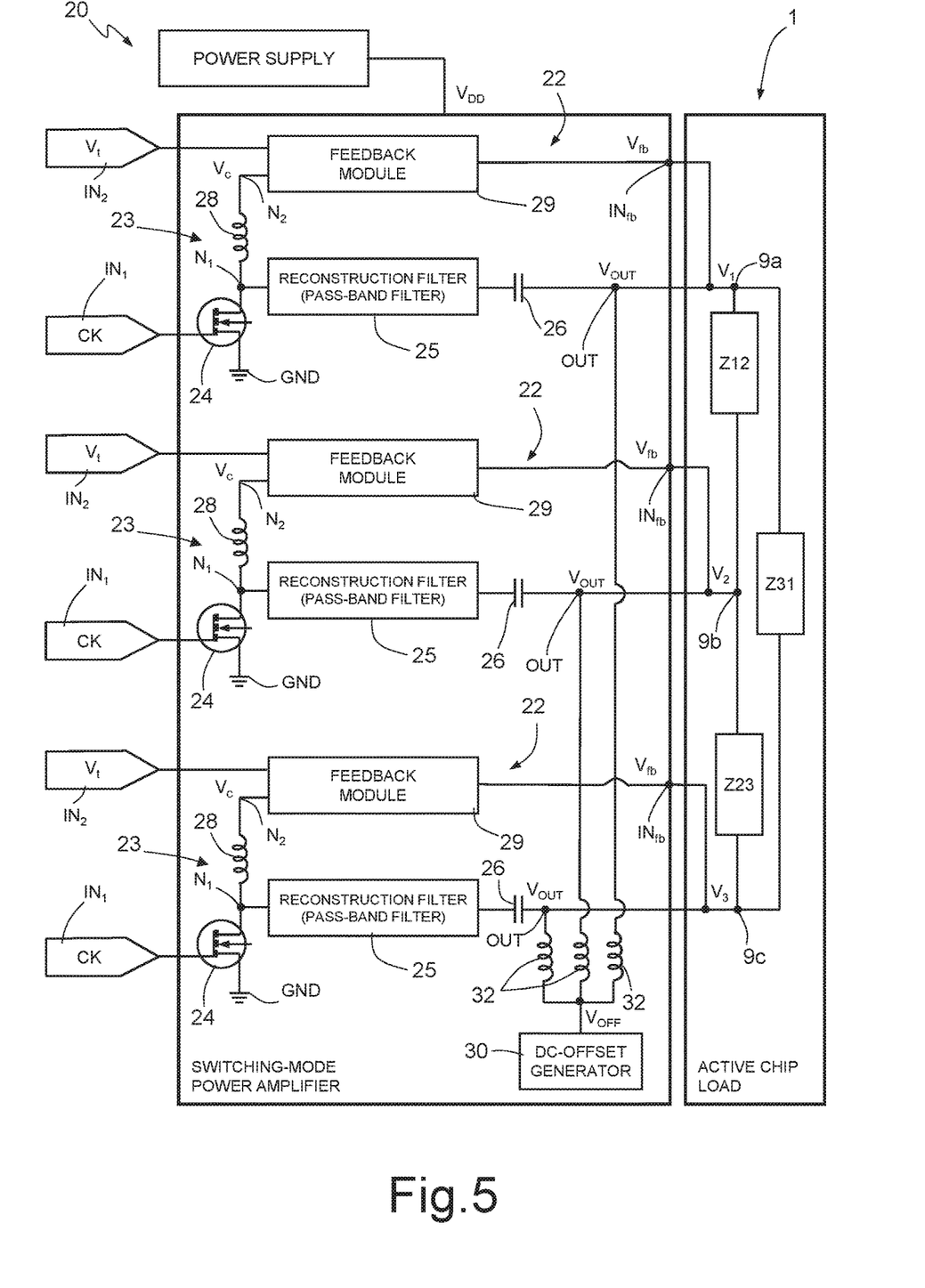
FIG. 5 is a schematic block diagram of the electronic driving circuit for the microfluidic device, according to a possible implementation of the present solution.
Figure 6:
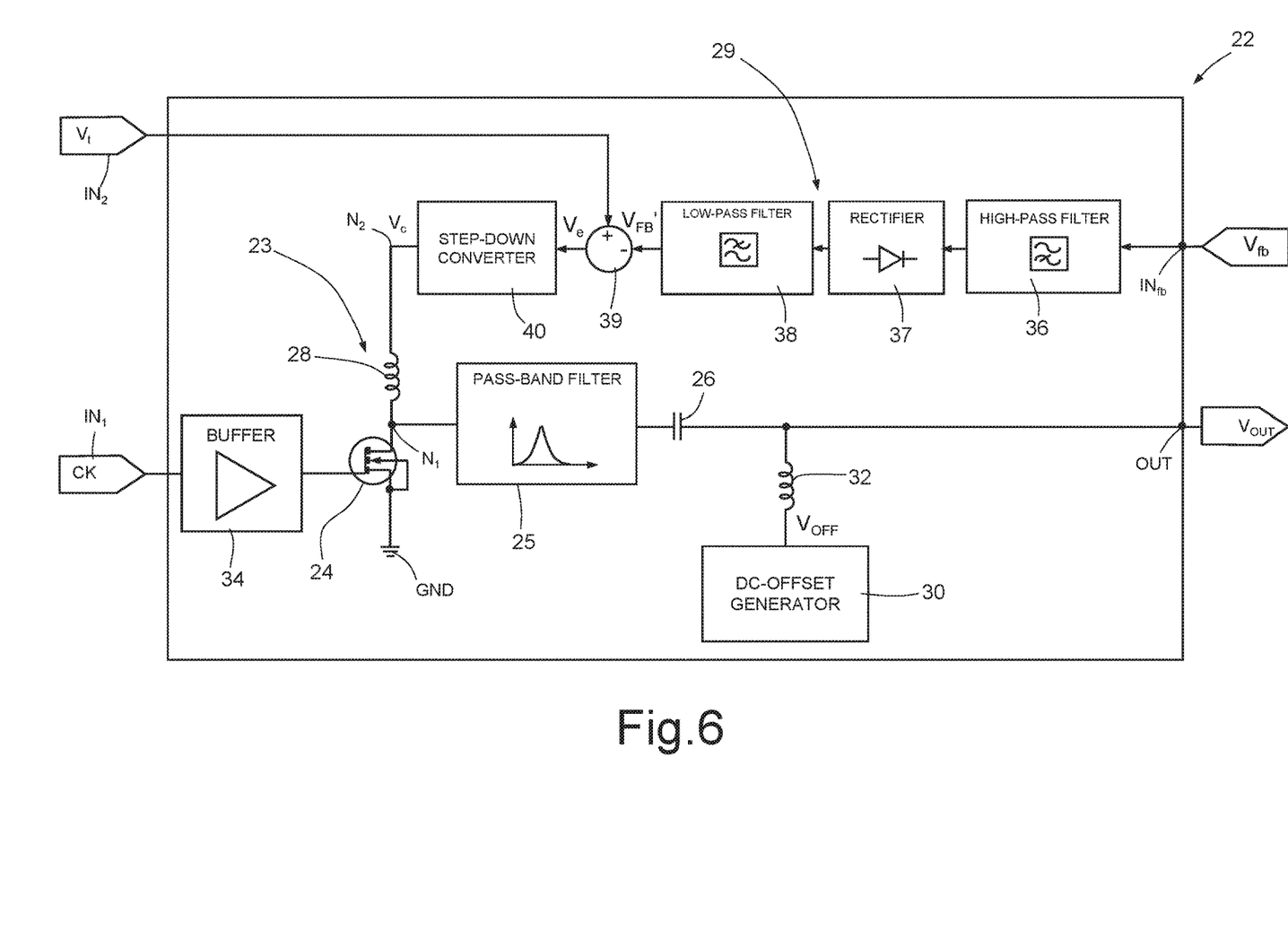
FIG. 6 is a schematic block diagram of an amplifier stage of the electronic driving circuit of FIG. 5.

As shown in FIGS. 5 and 6 (that correspond to above FIGS. 3 and 4, respectively), in a possible implementation, the switching module 23 comprises:

a switching element 24, in particular a transistor, e.g. a MOSFET transistor (a BJT, or any other suitable transistor), coupled between the reference terminal, or ground (GND), and the first internal node $N_1$, and having a control terminal (gate terminal of the MOSFET transistor) coupled to the first input $IN_1$ and receiving the clock signal CK;

an impedance element 28, in particular including an inductor element, coupled between the first internal node $N_1$ (being connected to the switching element 24) and the second internal node $N_2$, thus receiving the control signal $V_c$.

As will be evident, in this implementation, the impedance element 28 defines coupling between the first and second internal nodes $N_1$, $N_2$, selectively bringing the same second internal node $N_2$ to the control signal $V_c$, when the switching element 24 is open (the second internal node $N_2$ being instead brought to ground, when the same switching element 24 is closed).

The performance of the electronic driving circuit 20 has been evaluated by the present Applicant by means of extensive simulations and tests.

Figure 7A:
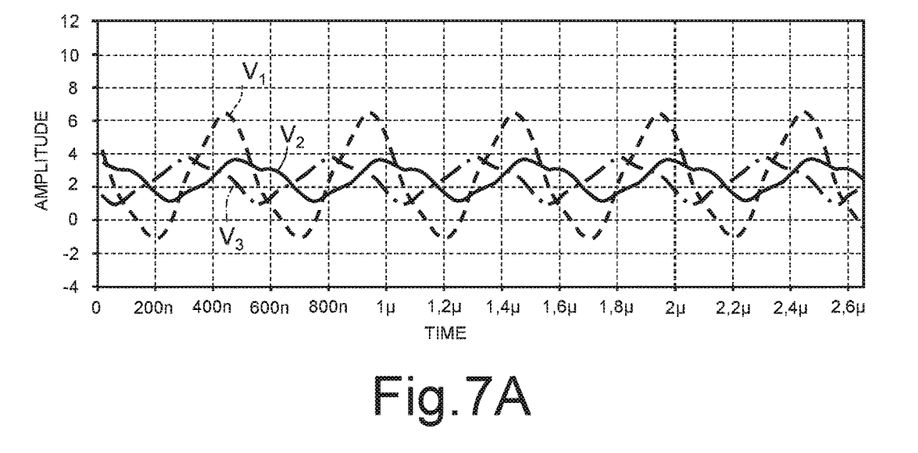
FIGS. 7a and 7b show plots of electrical quantities related to a known electronic driving circuit (FIG. 7a) and to the electronic driving circuit, according to the present solution (FIG. 7b)
Figure 7B:
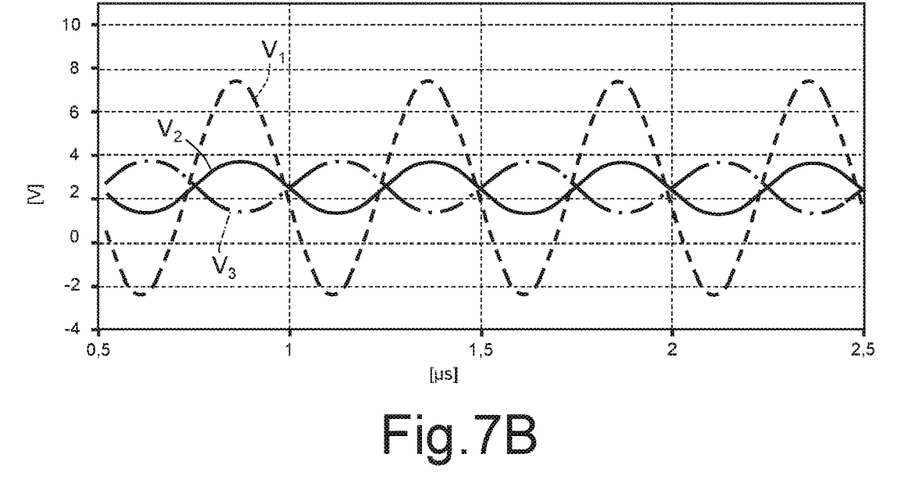

A comparison between the plots shown in FIGS. 7a and 7b allow to immediately perceive the improved performance of the electronic driving circuit 20 according to the present solution (plots of FIG. 7b) with respect to that of a traditional solution (plots of FIG. 7a).

In particular, FIG. 7a refers to an electronic driving circuit of a traditional type, including class-AB amplifiers; the generated sine waves show a strong harmonic distortion, and a maximum power higher than 150 W is required from the power supply source.

As shown in FIG. 7b, the sine waves generated by the electronic driving circuit 20 according to the present solution show negligible harmonic distortion and a desired phase shifting (the driving signals $V_1$ and $V_2$ being in-phase signals, while the driving signal $V_3$ being a counter-phase signal). Moreover, a maximum power lower than 70 W is required from the power supply source, in the same operating conditions.

Figure 8:
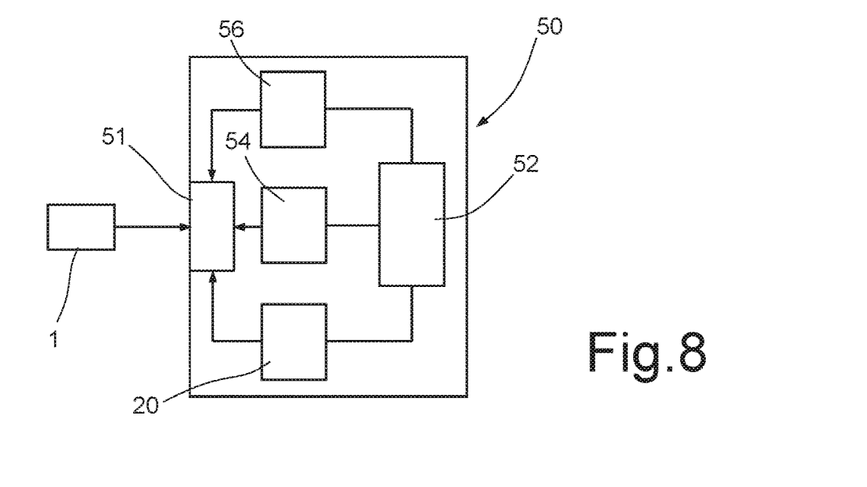
FIG. 8 is a schematic block diagram of an analysis machine, operatively coupled to the microfluidic device.

As schematically shown in FIG. 8, the electronic driving circuit 20 may be included in an electronic analysis apparatus 50, e.g. performing analysis operations on cells that are selected and sorted via the microfluidic device 1.

Analysis apparatus 50 is provided with a receptacle 51, designed to receive the microfluidic device 1 filled with a buffer solution wherein the particles 8 (e.g. cells) to be analyzed are immersed.

A control unit 52 of the analysis apparatus 50 controls the electronic driving circuit 20 in order to provide the driving signals $V_1$, $V_2$, $V_3$ to the electrodes 4, 6 of the same microfluidic device 1; in particular, the control unit 52 provides the clock signals CK and target signals $V_t$ to the amplifier stages 22, according to the analysis operations to be performed.

The analysis apparatus 50 may further include an imaging device 54, controlled by the control unit 52 to image the chamber 7 of the microfluidic device 1 and the particles 8 contained therein.

Control unit 52 is provided with suitable software to process the images acquired by the imaging device 54 and provide to a user visual depictions of the particles 8 in the microfluidic device 1 via a display (here not shown).

Particles 8 of interest may thus be identified and suitable driving signals $V_1$, $V_2$, $V_3$ may be provided to the electrodes 4, 6 in order to move the same particles towards a reservoir of the microfluidic device 1, from which the same particles 8 may be extracted by a pick-up device 56 of the analysis apparatus 50.

The advantages of the solution described emerge clearly from the previous discussion.

In particular, the amplifier stages 22, implementing the discussed closed-loop control, allow to minimize the non-linearity introduced by the low-impedance active chip load, thereby offering a drastic reduction of the total harmonic distortion (THD).

The unique and controlled DC offset voltage $V_{off}$, simultaneously injected at the output Out of the various amplifier stages 22, eliminates DC offset differences between the driving signals $V_1$, $V_2$, $V_3$ and thus allows to avoid possible electrolytic and electro-corrosion phenomena, gas bubbles formation and damages to the electrodes 4, 6.

Moreover, the electrical characteristics of the output signals $V_{out}$ may advantageously be controlled by varying the input clock and target signals ck, $V_t$, thus providing an easy to be configured driving solution (e.g. in terms of programmable amplitude, frequency and phase-shift of the driving signals $V_1$, $V_2$, $V_3$).

In general, the present solution allows to achieve, with respect to traditional solutions: a high efficiency with low impedance loads; a high reliability due to lower heat dissipation; a high thermal stability; and cost, size and weight reduction.

Finally, it is clear that modifications and variations can be made to what described and illustrated herein, without thereby departing from the scope of the present invention as defined in the appended claims.

In particular, it is underlined that the electronic driving circuit 20 may include a different (e.g. higher) number of amplifier stages 22, in the case in which it is required to drive a different (e.g. higher) number of electrodes or group of electrodes (that may in that case constitute a different electric-load configuration).

Moreover, the output signals $V_{out}$ may have different patterns, e.g. may be square waves, instead of sine waves.

The frequency of the same output signals $V_{out}$ may be fixed, chosen for example between 100 kHz and 100 MHz (e.g. 2 MHz), or variable during time, e.g. in the same range 100 kHz-100 MHz.

As an alternative, the feedback signals $V_{fb}$ may be picked-up at pick-up points external to the chip of the microfluidic device 1, for example within interface electronic devices that couple the electronic driving circuit 20 to the same chip of the microfluidic device 1.

It is moreover underlined that the discussed electronic driving circuit 20 may advantageously be used in different applications, where it is required to drive electrodes or group electrodes with driving signals, providing a low total harmonic distortion and a controlled DC offset.

The invention claimed is:

1. An electronic driving circuit (20) for a microfluidic device (1) having a number of electrodes (4,6), comprising a number of synchronized driving stages configured to generate a respective driving signal ($V_1$,$V_2$,$V_3$) for each electrode or group of electrodes (4,6), the driving signals ($V_1$,$V_2$,$V_3$) having a desired amplitude, frequency and phase-shift, wherein each driving stage includes a switching-mode amplifier stage (22) configured to receive a clock signal (CK) and a target signal ($V_t$) and to generate, at an output (Out) thereof, an output signal ($V_{out}$) defining a respective driving signal, the amplifier stage (22) comprising:

a switching module (23), coupled to a first internal node ($N_1$) and controlled by the clock signal (CK) for selectively bringing said first internal node ($N_1$) to a control signal ($V_c$);

a filter module (25,26), coupled between the first internal node ($N_1$) and the output (Out) and configured to provide the output signal ($V_{out}$); and a feedback module (29), coupled to a feedback input ($IN_{fb}$) of said driving stage to receive a feedback signal ($V_{fb}$) indicative of the value of the respective driving signal, wherein the feedback module (29) is configured to generate, as a function of a comparison between said feedback signal ($V_{fb}$) and said target signal ($V_t$), the control signal ($V_c$) for said switching module (23) and to provide such control signal (V,) to the switching module (23) to modulate the clock signal (CK) to adjust the output signal($V_{out}$).

2. The circuit according to claim 1, wherein each clock signal (CK) of each amplifier stage defines the frequency and phase-shift of the respective driving signals ($V_1,V_2,V_3$); and each target signal ($V_t$) defines the amplitude of the respective driving signals ($V_1,V_2,V_3$).

3. The circuit according to claim 1, wherein the filter module (25,26) includes a band-pass filter (25) configured to select an operating frequency of the output signal ($V_{Out}$), and a blocking capacitor (26), at the output of the band-pass filter (25), configured to block any DC component.

4. The circuit according to claim 1, further including an offset generator (30), coupled to each amplifier stage (22), configured to generate a unique offset voltage ($V_{off}$) that is injected at the output (Out) of said amplifier stages (22), to define a controlled DC offset value of the respective driving signals ($V_1,V_2,V_3$).

5. The circuit according to claim 4, further including an offset inductor (32) for each amplifier stage (22), each offset inductor (32) of each amplifier stage (22) having a first terminal in common, coupled to the output of the offset generator (30), and a second terminal coupled to the output (Out) of a respective amplifier stage (22).

6. The circuit according to claim 1, wherein the feedback module (29) includes: a filter-and-rectifier module (36-38), coupled to the feedback input ($IN_{fb}$) of the amplifier stage (22) and configured to provide a comparison signal ($V_{fb}'$), as a function of said feedback signal ($V_{fb}$); a subtraction unit (39), configured to receive the comparison signal ($V_{fb}'$) and the target signal ($V_t$), to generate an error signal ($V_e$), based on the difference between the comparison signal ($V_{fb}'$) and the target signal ($V_t$); and a voltage converter (40), coupled at the output of the subtraction unit (39) and configured to generate the control signal ($V_c$) based on the error signal ($V_e$).

7. The circuit according to claim 6, wherein the filter-and-rectifier module (36-38) includes: a high-pass filter (36), coupled to the feedback input ($IN_{fb}$) of the amplifier stage (22); a rectifier (37), coupled to the output of the high-pass filter (36); and a low-pass filter (38), coupled to the output of the rectifier (37).

8. The circuit according to claim 1, wherein the switching module (23) of the amplifier stage (22) comprises:

a switching element (24), coupled between a reference terminal (GND) and the first internal node ($N_1$), and having a control terminal designed to receive the clock signal (CK); and an impedance element (28), coupled between the first internal node ($N_1$) and a second internal node ($N_2$) configured to receive the control signal ($V_c$);

and wherein said feedback module (29) is connected between the feedback input ($IN_{fb}$) of said driving stage and the second internal node ($N_2$), and is configured to generate said control signal ($V_c$) on said second internal node ($N_2$).

9. The circuit according to claim 8, wherein said impedance element (28) includes an inductor element.

10. The circuit according to claim 1, wherein the microfluidic device (1) defines a non-linear variable impedance load for the electronic driving circuit (20).

11. The circuit according to claim 1, wherein the driving signals ($V_1,V_2,V_3$) are designed to generate dielectric fields at the electrodes (4,6) of the microfluidic device (1), as a function of the frequency, phase-shift and amplitude of the driving signals ($V_1,V_2,V_3$).

12. The circuit according to claim 11, wherein said dielectric fields are dielectrophoretic fields.

13. The circuit according to claim 12, wherein said dielectrophoretic fields define closed dielectrophoretic potential cages (11), designed to trap one or more particles (8) immersed in a fluid contained in the microfluidic device (1).

14. The circuit according to claim 1, wherein the output (Out) of each amplifier stage (22) is configured to be coupled to respective contact pads (9a,9b,9c) of the microfluidic device (1), electrically contacting respective electrode or group of electrodes (4,6).

15. The circuit according to claim 1, wherein said feedback signal ($V_{fb}$) is designed to be picked-up within said microfluidic device (1).

16. An automated analysis apparatus (50), comprising:

the electronic driving circuit (20) of claim 1;

a receptacle (51) configured to receive a microfluidic device (1); and a control unit (52) communicatively coupled to the electronic driving circuit (20) to control the electronic driving circuit (20), wherein the control unit (52) is configured to control the automated analysis apparatus (50) to cooperate with the microfluidic device (1) to perform analysis and/or separation operation on one or more particles (8) immersed in a fluid contained in the microfluidic device (1) by providing the clock signal (CK) and target signal ($V_t$) to each amplifier stage (22) of the electronic driving circuit (20).

17. In combination, a microfluidic device (1) and the electronic driving circuit (20) of claim 1, the microfluidic device (1) configured to manipulate particles (8) immersed in a fluid, the microfluidic device (1) including an array (2) of electrodes (4) carried by a substrate (5), and a plate electrode (6), arranged suspended above the array (2), an analysis chamber (7) containing the fluid being defined between the array (2) and the plate electrode (6), the microfluidic device (1) being configured to cooperate with the electronic driving circuit (20); wherein the driving signals ($V_1,V_2,V_3$) are designed to drive electrodes or group of electrodes (4,6), to generate dielectric fields at the electrodes (4), as a function of the frequency, phase-shift and amplitude of the driving signals ($V_1,V_2,V_3$).

* * * * *